United States Patent
Yoo et al.

(10) Patent No.: US 7,812,376 B2
(45) Date of Patent: Oct. 12, 2010

(54) NANOTUBE BASED NONVOLATILE MEMORY DEVICE AND A METHOD OF FABRICATING AND OPERATING THE SAME

(75) Inventors: Jin-Gyoo Yoo, Seongnam-si (KR); Soo-Il Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 664 days.

(21) Appl. No.: 11/592,178

(22) Filed: Nov. 3, 2006

(65) Prior Publication Data

US 2007/0132046 A1 Jun. 14, 2007

(30) Foreign Application Priority Data

Nov. 10, 2005 (KR) .................... 10-2005-00107646

(51) Int. Cl.
*H01L 29/68* (2006.01)
(52) U.S. Cl. .............................. 257/213; 257/E51.004; 257/E29.169; 257/415; 977/742; 977/784
(58) Field of Classification Search ...... 257/9, 257/40, E51.038–E51.04
See application file for complete search history.

(56) References Cited

U.S. PATENT DOCUMENTS 6,924,538 B2 8/2005 Jaiprakash et al.

2004/0181630 A1 9/2004 Jaiprakash et al.
2004/0240252 A1 12/2004 Pinkerton et al.
2005/0279988 A1* 12/2005 Bertin ........................... 257/9

OTHER PUBLICATIONS

Korean Office Action dated Oct. 30, 2006.
Chinese Office Action dated Jun. 5, 2009 in corresponding Chinese Application No. 200610142807.4. with English translation.

\* cited by examiner

*Primary Examiner*—Fernando L Toledo
*Assistant Examiner*—Mamadou Diallo
(74) *Attorney, Agent, or Firm*—Harness, Dickey & Pierce, P.L.C.

(57) ABSTRACT

Provided are a nonvolatile memory device and methods of fabricating and operating the same. The memory device may include a substrate, at least a first and a second electrode on the substrate to be spaced a distance from each other, a conductive nanotube between the first and second electrodes and selectively coming into contact with the first electrode or the second electrode due to an electrostatic force and a support supporting the conductive nanotube. The memory device may be an erasable nonvolatile memory device which may retain information even when no power is supplied and may ensure relatively high operating speed and relatively high integration density. Because the memory device writes and erases information in units of bits, the memory device may be applied to a large number of fields.

18 Claims, 7 Drawing Sheets

| SAMPLE | L (nm) | G1 (nm) | G2 (nm) | No. of Wall | $R_{in}$ (nm) | $R_{out}$ (nm) |
|---|---|---|---|---|---|---|
| #1 | 130 | 26 | 42 | 6 | 2 | 3.34 |
| #2 | 130 | 39 | 26 | 6 | 2 | 3.34 |

NANOTUBE BASED NONVOLATILE MEMORY DEVICE AND A METHOD OF FABRICATING AND OPERATING THE SAME

PRIORITY STATEMENT

This application claims priority under 35 USC §119 to Korean Patent Application No. 10-2005-0107646, filed on Nov. 10, 2005, in the Korean Intellectual Property Office (KIPO), the entire contents of which are incorporated herein by reference.

BACKGROUND

1. Field

Example embodiments relate to a nanotube based nonvolatile memory device and a method of fabricating and operating the same. Other example embodiments relate to a nonvolatile memory device using a bistable switching structure of a nanotube and a method of fabricating and operating the same.

2. Description of the Related Art

Examples of conventional memory devices include random access memories (RAMs), read only memories (ROMs), static random access memories (SRAMs) and/or magnetic random access memories (MRAMs). These semiconductor memory devices may be generally classified into volatile memory devices and nonvolatile memory devices, which have their own advantages and disadvantages. The fields of application for the semiconductor memory devices may be different.

In order to overcome the disadvantages of the conventional semiconductor memory devices and explore new fields of application, there is a demand for developing new memory devices. It is generally known that nonvolatile memory devices may operate slower than volatile memory devices. Research is being conducted into memory devices that may combine the advantages of both volatile memory devices and nonvolatile memory devices and that may be applied to a wider range of fields than conventional memory devices. For example, nanotube based memory devices are being researched and publicly reported.

The conventional art may suggest a nonvolatile memory device using a carbon nanotube (CNT) ribbon. However, the conventional nonvolatile memory device may be a write-once read-many (WORM) memory device, which is not suitable for a dynamic storage device. The conventional art may suggest a nonvolatile memory device using a set of parallel CNTs. The conventional nonvolatile memory device may create an ON state by deforming the facing CNTs while applying an electrical field and an OFF state by grounding and restoring the deformed CNTs. However, each nonvolatile memory device may require two CNTs and an appropriate distance may be maintained between the two CNTs. A support device for charging a space between the CNTs with an appropriate electrical potential may be required for the deformation of the CNTs, e.g., for memory retention.

SUMMARY

Example embodiments provide a nanotube memory device and a method of fabricating and operating the same. Example embodiments also provide a nanotube memory device that does not use an electrical charge for the purpose of memory retention and a method of fabricating and operating the same.

According to example embodiments, a nonvolatile nanotube memory device may include a substrate, at least a first and a second electrode on the substrate and spaced a distance from each other, a conductive nanotube between the first and second electrodes and selectively coming into contact with the first electrode or the second electrode according to an electrostatic force applied to the conductive nanotube and a support supporting the conductive nanotube.

According to example embodiments, a method of fabricating a nonvolatile nanotube memory device may include providing a substrate, forming a first electrode on the substrate, forming a conductive nanotube and a support supporting the conductive nanotube on the first electrode and forming a second electrode spaced a distance from the first electrode, wherein the conductive nanotube is between the first and second electrodes and selectively comes into contact with the first electrode or the second electrode according to an electrostatic force applied to the conductive nanotube.

According to example embodiments, a method of operating a nonvolatile nanotube memory device may include maintaining a switching device in the on state and applying a write voltage between a conductive nanotube and a first electrode. A method of operating the nonvolatile nanotube memory device may also include maintaining a switching device in the off state and applying an erase voltage between a conductive nanotube and a second electrode. The state of the switching device may be determined by whether or not the nanotube is in contact with the first electrode. The state of the switching device may be determined by a deformation of the nanotube caused by an applied electrical field.

The conductive nanotube may have one end fixed to the support. The support may be separated into two unit supports and both ends of the conductive nanotube may be fixed to the two unit supports. The nonvolatile nanotube memory device may further include a third electrode, such that the first, second and third electrodes may be adjacent to the conductive nanotube. The conductive nanotube may be attached to any one of the first through third electrodes according to the position of an electrostatic force.

A gap between the second electrode and the conductive nanotube may be determined so that when the conductive nanotube contacts the second electrode due to an elastic deformation of the conductive nanotube, the elastic restoring force of the conductive nanotube may be greater than the Van der Waals force generated between the conductive nanotube and the second electrode.

BRIEF DESCRIPTION OF THE DRAWINGS

Example embodiments will be more clearly understood from the following detailed description taken in conjunction with the accompanying drawings. FIGS. 1-8 represent non-limiting, example embodiments as described herein.

FIG. 1 is a diagram illustrating a memory device according to example embodiments;

FIG. 3 is a diagram illustrating a memory device according to other example embodiments;

FIG. 5 is a diagram and a table illustrating configurations of first and second samples used for analyzing the operation of a memory device according to example embodiments;

FIG. 7 is a diagram illustrating a memory device according to other example embodiments; and FIG. 8 is an image of a conductive nanotube applied to a memory device according to example embodiments.

DETAILED DESCRIPTION OF EXAMPLE EMBODIMENTS

Figure 1:
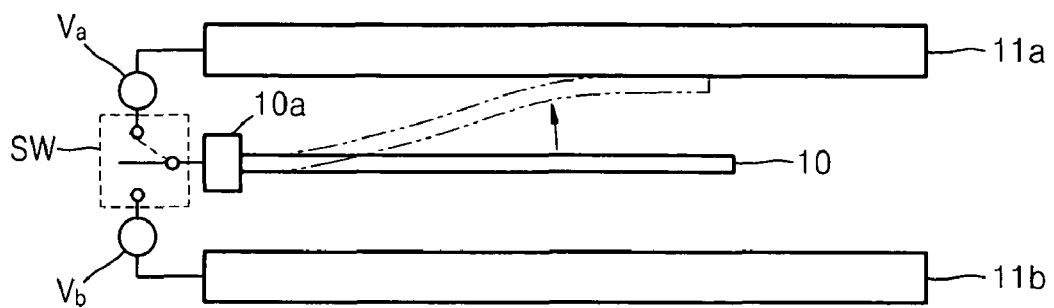

Example embodiments are described more fully hereinafter with reference to the accompanying drawings, in which example embodiments are shown. Example embodiments may, however, be embodied in many different forms and should not be construed as limited to the embodiments set forth herein. Rather, these embodiments are provided so that this disclosure will be thorough and complete and will fully convey the scope of example embodiments to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a nanotube memory device according to example embodiments. Referring to FIG. 1, the nanotube memory device may be an erasable nonvolatile memory device. The memory device may write information by mechanically deforming a conductive nanotube (or nanorod) corresponding to recorded information. The memory device may write information using a difference in the electrical relationship between first and second electrodes $11a$ and $11b$ and a conductive nanotube 10 having an end fixed to a conductive support $10a$. The electrical characteristics used for writing information in the memory device may include an electrical ON state and an electrical OFF state between them.

The nanotube memory device may be in the ON or OFF state according to whether the conductive nanotube 10 is in contact with the first electrode $11a$, and the state may be determined by a deformation of the conductive nanotube 10 caused by an applied electrical field, for example, an electrostatic force. Bit information may be written using the electrical ON and OFF state switching structure. The second electrode $11b$ may form an electrical field together with the conductive nanotube 10 and may return the conductive nanotube 10 attached to the first electrode $11a$ to its initial position. During a write operation, a first voltage $V_a$, e.g., a write voltage, may be applied between the first electrode $11a$ and the conductive nanotube 10, and during an erase operation, a second voltage $V_b$, e.g., an erase voltage, may be applied between the second electrode $11b$ and the conductive nanotube 10.

The deformation of the conductive nanotube 10 for writing bit information and the maintenance of the contact of the conductive nanotube 10 with the first electrode $11a$ may be caused by the two forces, for example, the force generated by the electrical field and the Van der Waals force, respectively. The electrical field may be produced by the first voltage $V_a$ applied between the conductive nanotube 10 and the first electrode $11a$.

Figure 2A:
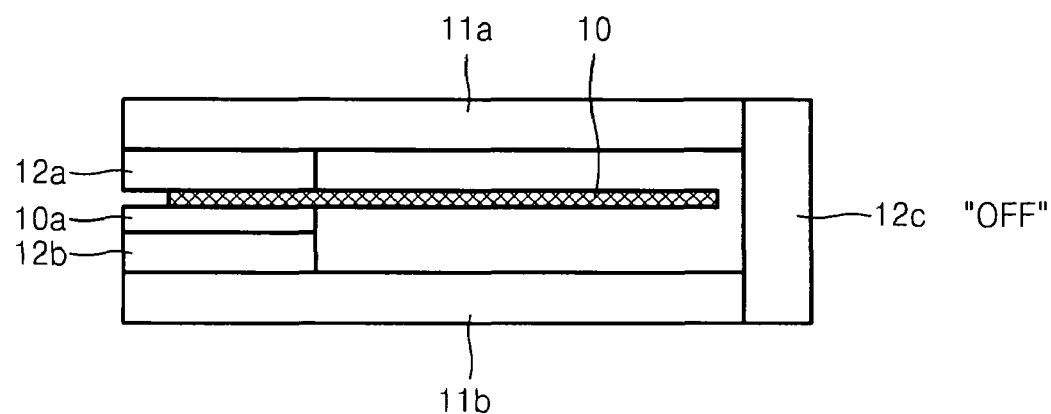
FIGS. 2A-2D are diagrams of the memory device of FIG. 1, illustrating a method of storing and erasing information.
Figure 2B:
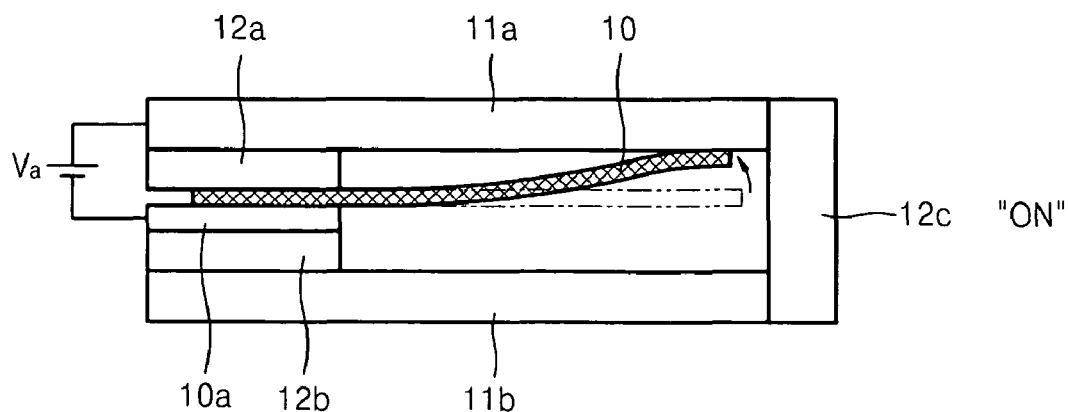

FIGS. 2A-2D are diagrams illustrating the memory device of FIG. 1. FIG. 2A illustrates the OFF state where the conductive nanotube 10 is not in contact with the first electrode $11a$. Referring to FIG. 2B, when a first voltage $V_a$ is supplied to form an electrical field between the first electrode $11a$ and the conductive nanotube 10, the conductive nanotube 10 may come into contact with the first electrode 11a due to an electrostatic force caused by the electrical field. When the conductive nanotube 10 comes into contact with the first electrode 11a, the conductive nanotube 10 and the first electrode 11a may become electrically connected to each other and may be thus in an ON state. The conductive nanotube 10 may be attached to the first electrode 11a due to a Van der Waals force ($F_v$) that is present when the conductive nanotube 10 and the first electrode 11a are in contact with each other.

Figure 2C:
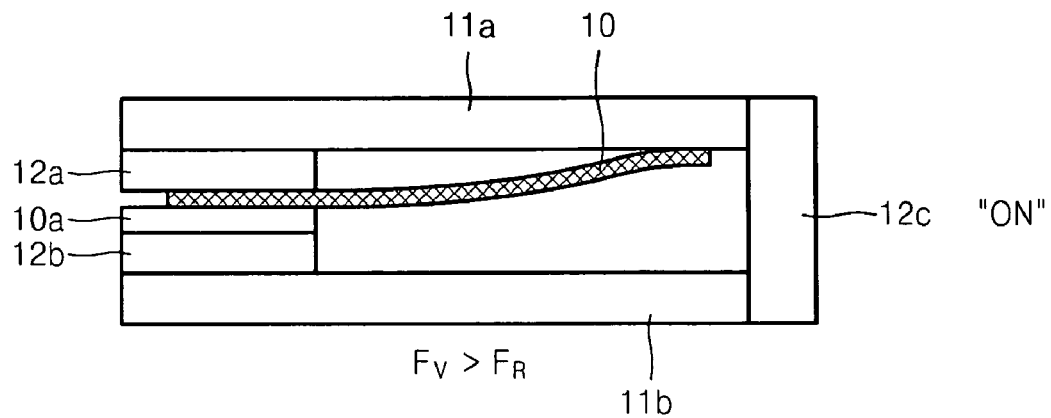

In example embodiments, the Van der Waals force $F_v$ may be greater than the elastic restoring force $F_R$ of the conductive nanotube 10. Referring to FIG. 2C, even after the first voltage $V_a$ applied between the first electrode 11a and the conductive nanotube 10 is removed, the conductive nanotube 10 may still be attached to the first electrode 11a. The contact between the conductive nanotube 10 and the first electrode 11a may be more stably maintained even when no electrical field is applied. The elastic restoring force $F_R$ may not be greater than the Van der Waals force $F_v$, which may be calculated by a well-known numerical analysis. The first voltage $V_a$ may be set so that the conductive nanotube 10 may be elastically deformed and may become attached to the first electrode 11a. The conductive nanotube 10 may be elastically restored by an electrostatic force generated due to a second voltage $V_b$ applied between the conductive nanotube 10 and the second electrode 11b and by the elastic restoring force $F_R$ of the conductive nanotube 10.

Figure 2D:
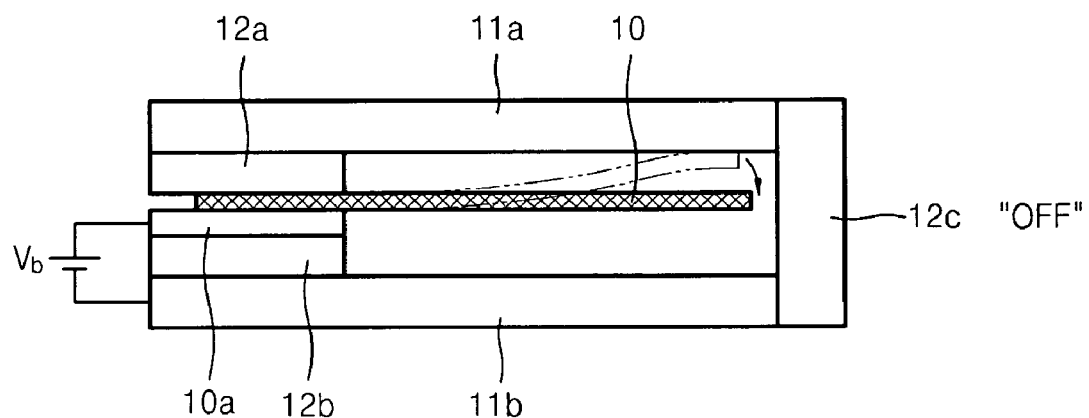

Referring to FIG. 2D, when the second voltage $V_b$ is applied between the conductive nanotube 10 and the second electrode 11b, the conductive nanotube 10 may separate from the first electrode 11a and may be elastically restored. The second voltage $V_b$ required may depend on the elastic restoring force $F_R$ of the conductive nanotube 10. In order to separate the conductive nanotube 10 from the first electrode 11a, a force greater than the Van der Waals force $F_v$ may be applied to the conductive nanotube 10. Because the conductive nanotube 10 already has the elastic restoring force $F_R$ acting against the Van der Waals force $F_v$, the reduced or minimum level of the second voltage $V_b$ that may separate the conductive nanotube 10 from the first electrode 11a may correspond to the difference ($F_v$-$F_R$) between the Van der Waals force $F_v$ and the elastic restoring force $F_R$. As described above, the nonvolatile memory device according to example embodiments may be bistable, having both ON and OFF states, without requiring a residual charge or an external power source. While the memory device of FIG. 1 uses a conductive nanotube, the memory device of FIG. 3 may use a suspended conductive nanotube or a simply supported beam type conductive nanotube that is supported at both ends. In example embodiments, the conductive nanotube 10 is a projection from the spacers 12a and 12b. In other example embodiments, the conductive nanotube 10 is a cantilever from the spacers 12a and 12b.

Figure 3:
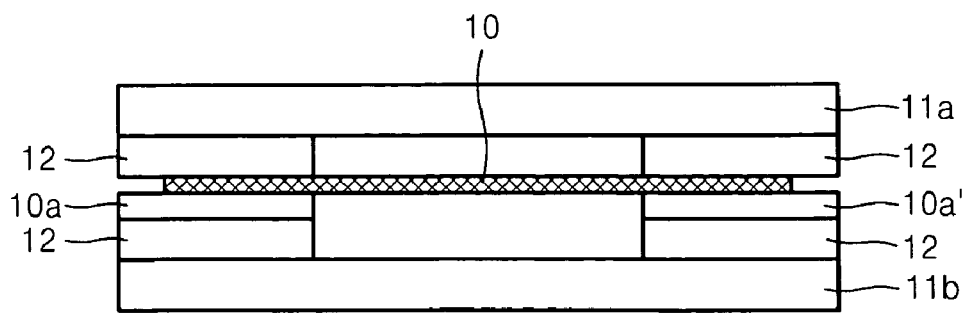

FIG. 3 is a diagram illustrating a memory device according to other example embodiments. Referring to FIG. 3, a plurality of spacers 12 may be arranged at both ends of first and second electrodes 11a and 11b to be inserted between the first electrode 11a and the second electrode 11b. A conductive nanotube 10 may be inserted between the first electrode 11a and the second electrode 11b to be parallel to the first and second electrodes 11a and 11b. Conductive supports 10a' may be disposed under both ends of the conductive nanotube 10, and the conductive nanotube 10 may slide in a longitudinal direction on the conductive supports 10a. The operation of the memory device of FIG. 3 may be the same as that of the memory device of FIG. 1, except that both movable ends of the conductive nanotube 10 may be supported by the spacers 12.

Figure 4A:
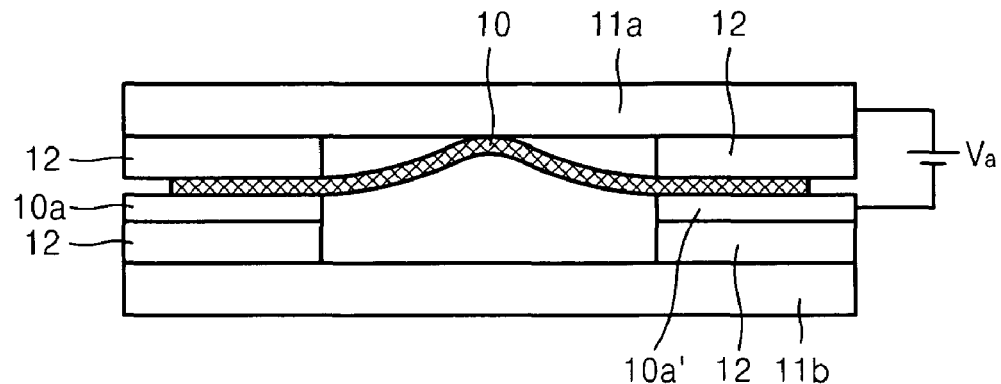
FIGS. 4A-4C are diagrams of the memory device of FIG. 3, illustrating a method of writing and erasing information.
Figure 4B:
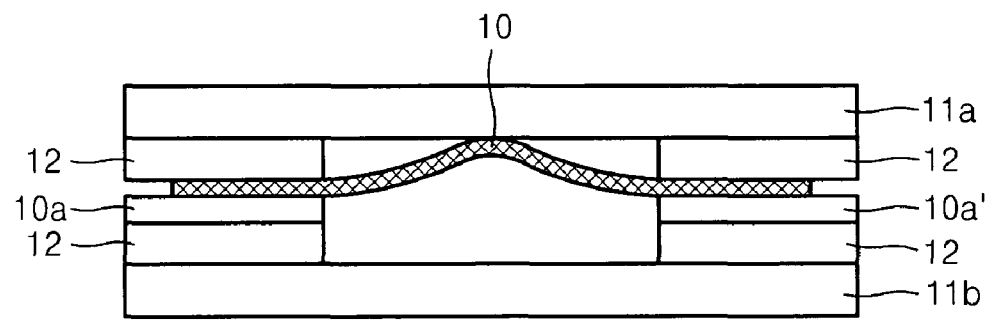
Figure 4C:
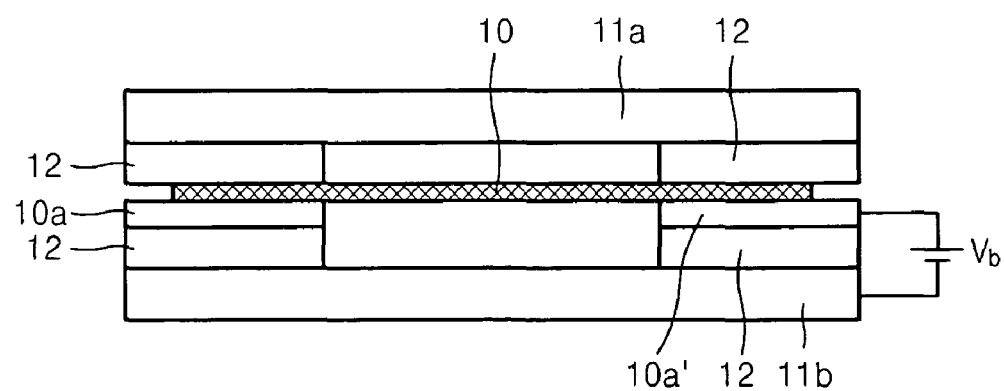

FIGS. 4A-4C are diagrams illustrating the memory device of FIG. 3 for explaining the operation of the memory device. Referring to FIG. 4A, when a first voltage $V_a$ is applied between the first electrode 11a and the conductive nanotube 10, the conductive nanotube 10 may be bent due to an electrostatic force to come into contact with the first electrode 11a. Referring to FIG. 4B, even after the first voltage $V_a$ is removed, the conductive nanotube 10 may still be attached to the first electrode 11a due to a Van der Waals force. Referring to FIG. 4C, when a second voltage $V_b$ is applied between the second electrode 11b and the conductive nanotube 10, the conductive nanotube 10 may become restored by an electrostatic force due to the applied voltage and the elastic restoring force of the conductive nanotube 10. A numerical analysis performed to analyze the operation of a memory device according to example embodiments and results of the numerical analysis may now be explained with reference to FIGS. 5 and 6. In example embodiments, the conductive nanotube 10 may be a supported projection or supported beam from the spacers 12a, 12b and 12c.

Figure 5:
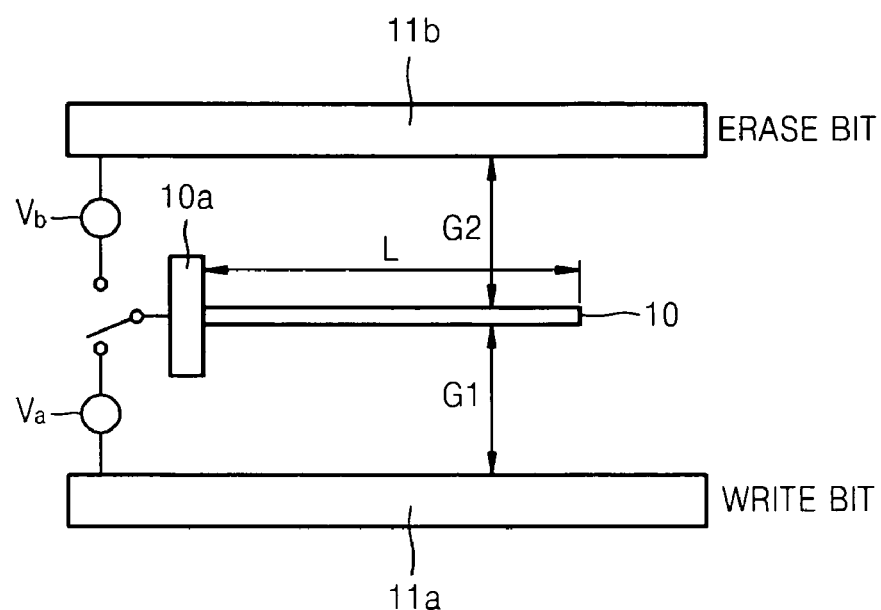

FIG. 5 is a diagram and a table illustrating configurations of memory device samples which may be numerically analyzed. Each of the first and second memory device samples #1 and #2 which are numerically analyzed may be configured such that a conductive nanotube 10 may have a six-walled structure with an inner diameter of about 2 nm, an outer diameter of about 3.34 nm, and a length of about 130 nm. A gap G1 between the conductive nanotube 10 and a first electrode 11a and a gap G2 between the conductive nanotube 10 and a second electrode 11b may be about 26 nm and about 42 nm, respectively, in the case of the first sample #1, and about 39 nm and about 26 nm, respectively, in the case of the second sample #2.

Figure 6A:
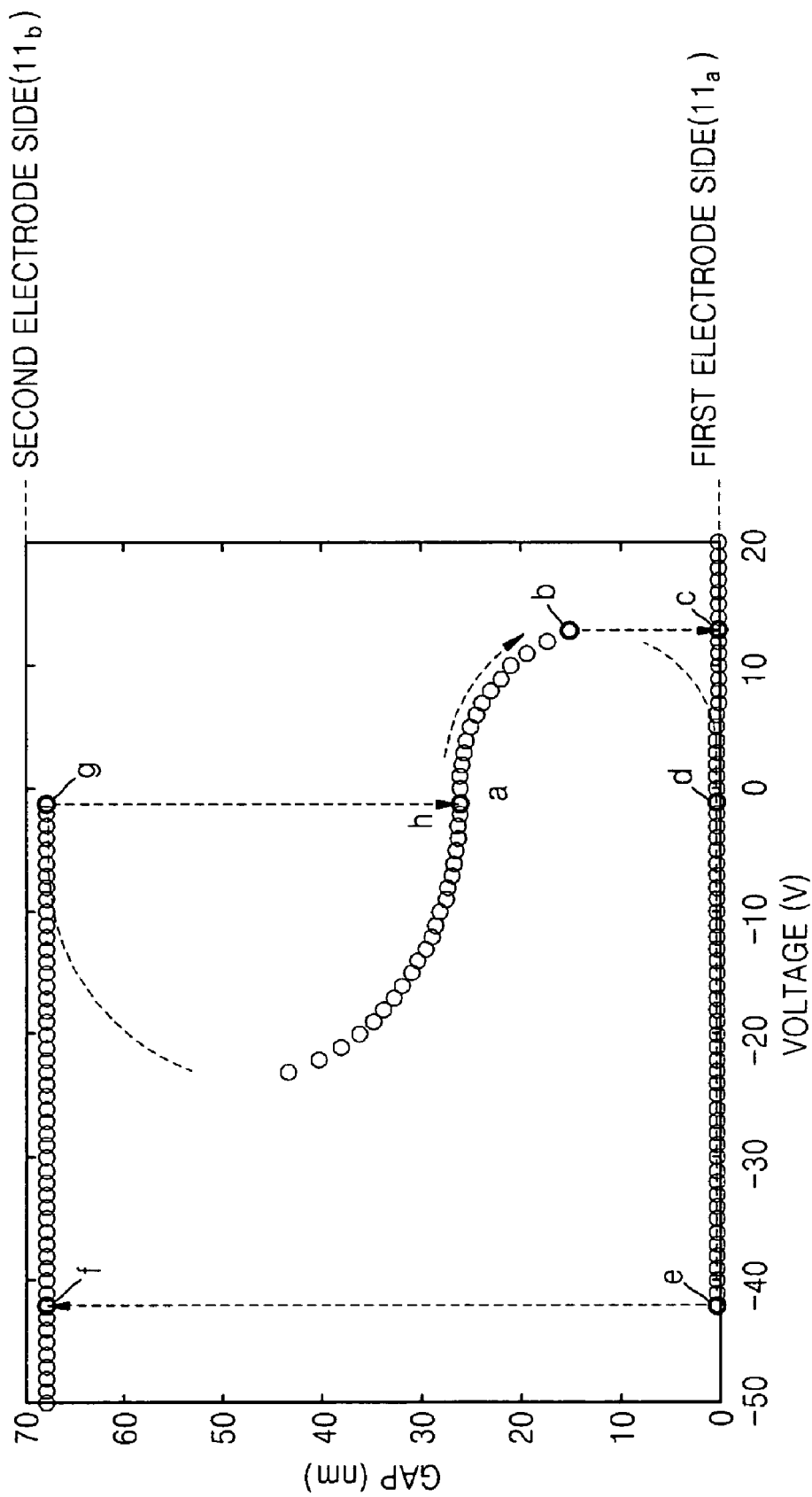
FIGS. 6A and 6B are graphs illustrating analysis results of the first and second samples of FIG. 5.
Figure 6B:
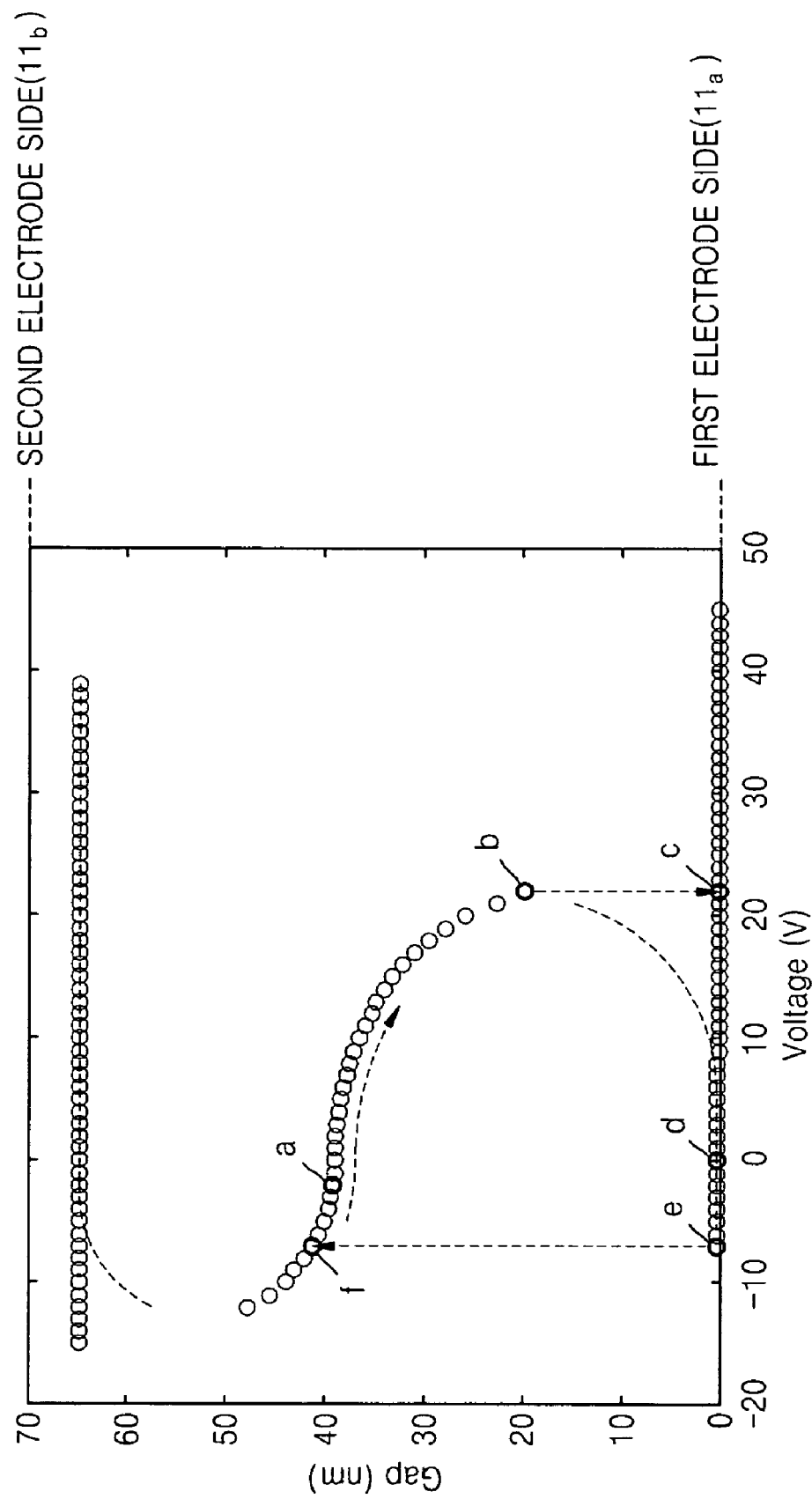

FIGS. 6A and 6B are graphs illustrating the results of the numerical analysis performed on the first and second samples of FIG. 5. In detail, FIG. 6A is a graph illustrating the analysis results of the first sample #1, and FIG. 6B is a graph illustrating the analysis results of the second sample #2. The analysis results show a relation between voltages $V_a$ and $V_b$ applied to the first and second electrodes 11a and 11b and the size of the gaps G1 and G2 between the conductive nanotube 10 and the first and second electrodes 11a and 11b.

The gap between the conductive nanotube 10 and each of the first and second electrodes 11a and 11b will be explained in alphabetical order of the letters present in the graph of FIG. 6A. When the conductive nanotube 10 was in its initial position (a) and a voltage $V_a$ applied between the conductive nanotube 10 and the first electrode 11a was increased from about zero (0) Volts to about 10 Volts, the gap G1 between the conductive nanotube 10 and the first electrode 11a nonlinearly decreased (b) and became about zero (0) at between about 11 and about 12 Volts (c). The conductive nanotube 10 may be sufficiently deformed at about 12 Volts or so to come into contact with the first electrode 11a. Even when the voltage $V_a$ was decreased to about zero (0) Volts (d), the conductive nanotube 10 may still be attached to the first electrode 11a. This state may correspond to an ON state and/or relatively high bit information and may be maintained when the power is turned off. The contact between the conductive nanotube 10 and the first electrode 11a may be maintained because the conductive nanotube 10 may be deformed and the elastic restoring force of the conductive nanotube 10 may be less than a Van der Waals force present. A voltage $V_b$ applied between the second electrode 11b and the conductive nanotube 10 may be gradually increased to separate the conductive nanotube 10 from the first electrode 11a (e.g., to change the ON state to an OFF state). The conductive nanotube 10 may still be attached to the first electrode 11a even when the voltage $V_b$ applied between the conductive nanotube 10 and the second electrode 11b was increased to about −40 Volts.

However the conductive nanotube separated from the first electrode 11a when the voltage $V_b$ reached about −42 Volts (e) and then became attached to the second electrode 11b (f). When the voltage $V_a$ applied between the first electrode 11a and the conductive nanotube 10 decreases to about zero (0) Volts (g) the conductive nanotube 10 may be restored to its initial position (h). Information may be written and erased through this process. It may be seen from FIG. 6A that the conductive nanotube 10 and the first electrode 11a come into contact when a predetermined or given voltage $V_a$ is applied between the first electrode 11a and the conductive nanotube 10 and, even after the voltage $V_a$ is removed, the conductive nanotube 10 may still be attached to the first electrode 11a. Also, the conductive nanotube 10 and the second electrode 11b may become separated from each other when no voltage $V_b$ is applied because the elastic restoring force of the elastically deformed conductive nanotube 10 is greater than a Van der Waals force between the second electrode 11b and the conductive nanotube 10 due to the relatively large initial gap G2 between the conductive nanotube 10 and the second electrode 11b.

A variable of the elastic restoring force, for example, an initial gap between each of the electrodes 11a and 11b and the conductive nanotube 10, may be appropriately adjusted. The initial gaps may be set in consideration of the deforming properties of the conductive nanotube 10. In the case of the first sample #1, the gap G1 between the first electrode 11a and the conductive nanotube 10 may be less than the gap G2 between the second electrode 11b and the conductive nanotube 10. However, in the case of the second sample #2, the gap G1 between the first electrode 11a and the conductive nanotube 10 may be greater than the gap G2 between the second electrode 11b and the conductive nanotube 10.

Referring to FIG. 6B, when the conductive nanotube 10 was in an initial position (a) such that the initial gap G1 between the first electrode 11a and the conductive nanotube 10 was 39 nm, and a voltage $V_a$ that was applied between the conductive nanotube 10 and the first electrode 11a was increased to about 20 Volts, the gap G1 nonlinearly decreased (b) to become zero (0) at between about 21 and 22 about Volts (c). The conductive nanotube 10 may be sufficiently deformed at about 22 Volts to come into contact with the first electrode 11a. When the voltage $V_a$ decreased to about zero (0) Volts, the conductive nanotube 10 may still be attached to the first electrode 11a (d). This state may correspond to an ON state and/or relatively high bit information and may be maintained when power is turned off. The contact between the conductive nanotube 10 and the first electrode 11a may be maintained because the conductive nanotube 10 was deformed and the elastic restoring force of the conductive nanotube 10 was less than a Van der Waals force between the conductive nanotube 10 and the first electrode 11a.

When a voltage $V_b$ applied between the second electrode 11b and the conductive nanotube 10 was gradually increased to separate the conductive nanotube 10 from the first electrode 11a, (e.g., to change the ON state to an OFF state), the conductive nanotube 10 may still be attached to the first electrode 11a until the voltage $V_b$ applied between the conductive nanotube 10 and the second electrode 11b reached between about −8 to about −9 Volts (e), as opposed to about −42 Volts in the memory device of FIG. 6A. After the conductive nanotube 10 was separated from the first electrode 11a, it may move to a point (f) spaced a considerable distance from the second electrode 11b, and then may be restored to the initial position (a). The second sample #2 may be different from the first sample #1 in that, during an erase operation (e.g., when the conductive nanotube 10 separates from the first electrode 11a), the conductive nanotube 10 may be immediately restored to the initial position without first being attached to the second electrode 11b.

Figure 7:
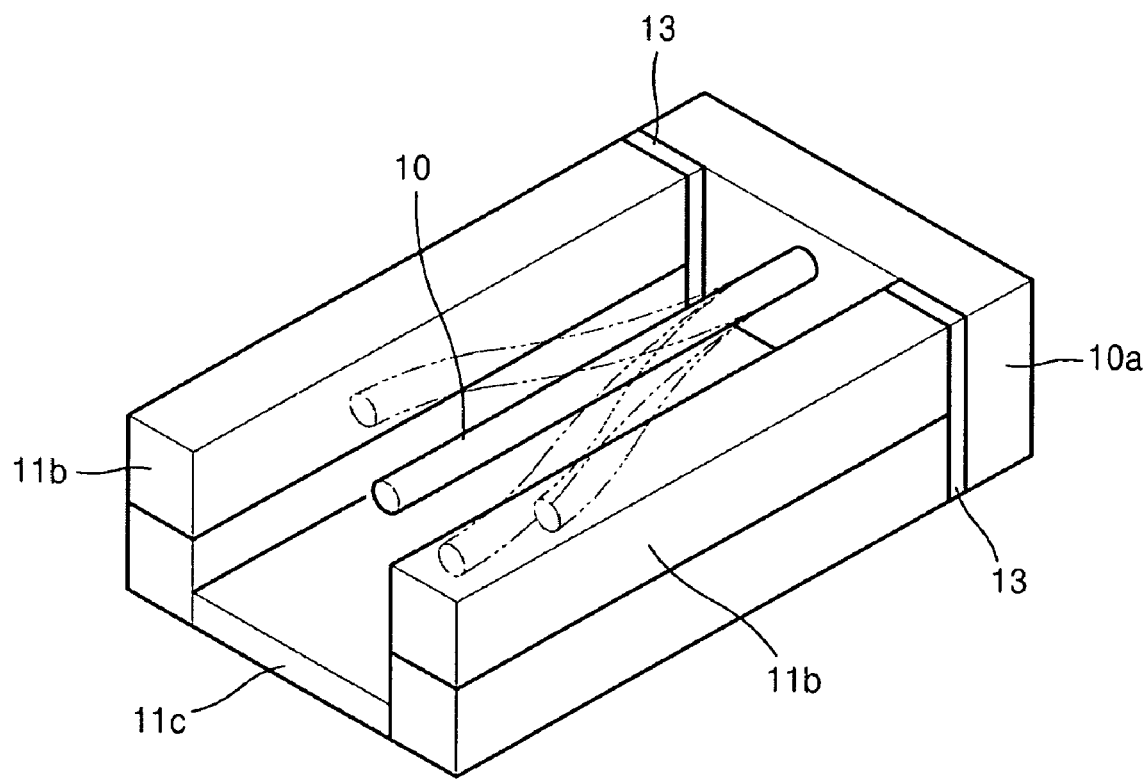
Figure 8:
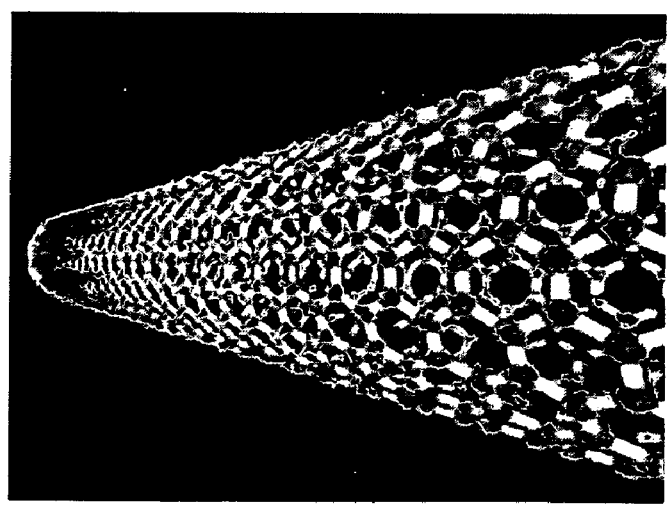

FIG. 7 is a diagram illustrating a memory device according to other example embodiments. Referring to FIG. 7, the memory device may include a conductive nanotube 10 acting as an actuator and a plurality of electrodes 11a, 11b, and 11c surrounding the conductive nanotube 10. Insulating materials 13 may mutually support the electrodes 11a, 11b, and 11c. When one of the three electrodes 11a, 11b, and 11c that surround the conductive nanotube 10 is selected and a voltage (e.g., $V_a$ and/or $V_b$) is applied between the selected electrode and the conductive nanotube 10 in the aforesaid operation method, the conductive nanotube 10 may contact the selected electrode as described above and the contact may be maintained due to a Van der Waals force. When a predetermined or given voltage is applied between an unselected electrode and the conductive nanotube 10 to separate the conductive nanotube 10 from the selected electrode (e.g., to erase information), the conductive nanotube 10 may be restored to its initial position. FIG. 8 is an image of a netting-shaped conductive nanotube applicable to a memory device according to example embodiments. Instead of the netting shaped conductive nanotube, a single-walled conductive nanotube and/or a multi-walled conductive nanotube may also be used. The conductive nanotube according to example embodiments may be grown using a well-known catalyst and/or separately manufactured and then assembled to a memory device.

When a plurality of memory devices are arranged in an array form, like in a conventional memory device structure, a relatively large capacity memory device may be realized. As described above, the memory device according to example embodiments may be an erasable nonvolatile memory device that may retain information when power is turned off and may ensure relatively high operating speed and relatively high integration density. Also, the memory device may write and erase information in units of bits, and thus it may be applied to a large number of fields. The memory device according to example embodiments may be applied to electrically bistable and/or multi-stable micro switching elements as well as memories.

While example embodiments have been particularly shown and described with reference to example embodiments thereof, it will be understood by those of ordinary skill in the art that various changes in form and details may be made therein without departing from the spirit and scope of the following claims.

What is claimed is:

1. A nonvolatile nanotube memory device comprising:
   a substrate;
   at least a first and a second electrode on the substrate spaced a distance from each other;
   a conductive nanotube between the first and second electrodes and selectively coming into contact with the first electrode or the second electrode according to an electrostatic force applied to the conductive nanotube; and
   a support supporting the conductive nanotube and including a first conductive layer configured to directly contact the conductive nanotube; and
   a voltage applying unit configured to apply a write voltage between the first conductive layer and one of the at least first and second electrodes, wherein the electrostatic force is applied to the conductive nanotube by the write voltage.

2. The nonvolatile nanotube memory device of claim 1, wherein the conductive nanotube has one end fixed to the support.

3. The nonvolatile nanotube memory device of claim 2, wherein the support further includes at least two spacers with one end of the conductive nanotube between the at least two spacers.

4. The nonvolatile nanotube memory device of claim 1, wherein the conductive nanotube is supported at both ends.

5. The nonvolatile nanotube memory device of claim 4, wherein the support further includes a plurality of spacers between and at both ends of the first and second electrodes.

6. The nonvolatile nanotube memory device of claim 1, further comprising:
a third electrode, such that the first, second and third electrodes are adjacent to the conductive nanotube.

7. The nonvolatile nanotube memory device of claim 1, wherein a gap between the first electrode and the conductive nanotube is such that when the conductive nanotube contacts the first electrode due to an elastic deformation of the conductive nanotube, the elastic restoring force of the conductive nanotube is less than the Van der Waals force generated between the conductive nanotube and the first electrode.

8. The nonvolatile nanotube memory device of claim 1, wherein a gap between the second electrode and the conductive nanotube such that when the conductive nanotube contacts the second electrode due to an elastic deformation of the conductive nanotube, the elastic restoring force of the conductive nanotube is greater than the Van der Waals force generated between the conductive nanotube and the second electrode.

9. The nonvolatile nanotube memory device of claim 1, wherein an erase voltage is applied between the first conductive layer and the other of the first and second electrodes.

10. The nonvolatile nanotube memory device of claim 6, wherein the write voltage is applied between the first conductive layer and one of the first through third electrodes.

11. The nonvolatile nanotube memory device of claim 10, wherein an erase voltage is applied between the first conductive layer and another of the first through third electrodes.

12. The nonvolatile nanotube memory device of claim 1, wherein each of the first and second electrodes has a length to cover the conductive nanotube.

13. A nonvolatile nanotube memory device comprising:
a substrate;
at least a first and a second electrode on the substrate spaced a distance from each other;
a conductive nanotube between the first and second electrodes and selectively coming into contact with the first electrode or the second electrode according to an electrostatic force applied to the conductive nanotube; and
a support supporting the conductive nanotube and including a first conductive layer configured to directly contact the conductive nanotube,
wherein the conductive nanotube is supported at both ends and the support further includes a plurality of spacers between and at both ends of the first and second electrodes.

14. A nonvolatile nanotube memory device comprising:
a substrate;
at least a first and a second electrode on the substrate spaced a distance from each other;
a conductive nanotube between the first and second electrodes and selectively coming into contact with the first electrode or the second electrode according to an electrostatic force applied to the conductive nanotube; and
a support supporting the conductive nanotube and including a first conductive layer configured to directly contact the conductive nanotube,
wherein the support is separate from the first and second electrodes.

15. The nonvolatile nanotube memory device of claim 14, wherein the conductive nanotube has one end fixed to the support.

16. The nonvolatile nanotube memory device of claim 15, further comprising:
at least two spacers with one end of the conductive nanotube between the at least two spacers.

17. The nonvolatile nanotube memory device of claim 14, wherein the conductive nanotube is supported at both ends.

18. The nonvolatile nanotube memory device of claim 17, further comprising:
a plurality of spacers between and at both ends of the first and second electrodes.

* * * * *